United States Patent [19]

Crafts et al.

[11] Patent Number: 5,759,877
[45] Date of Patent: Jun. 2, 1998

[54] SEMICONDUCTOR FUSE STRUCTURE

[75] Inventors: Harold S. Crafts, Colorado Springs; William W. McKinley, Fort Collins; Mark Q. Scaggs, Parker, all of Colo.

[73] Assignees: AT&T Global Information Solutions Company, Dayton, Ohio; Hyundai Electronics America, San Jose, Calif.; Symbios, Inc., Fort Collins, Colo.

[21] Appl. No.: 839,426

[22] Filed: Apr. 14, 1997

Related U.S. Application Data

[60] Continuation of Ser. No. 351,979, Dec. 8, 1994, abandoned, which is a division of Ser. No. 832,177, Feb. 5, 1992, Pat. No. 5,376,820.

[51] Int. Cl.[6] .................................................. H01L 21/82
[52] U.S. Cl. .................................... 438/132; 438/467
[58] Field of Search ............................... 438/132, 467, 438/433

[56] References Cited

U.S. PATENT DOCUMENTS

| | | | |
|---|---|---|---|
| 4,045,310 | 8/1977 | Jones et al. | 204/129.4 |
| 4,651,409 | 3/1987 | Ellsworth et al. | 29/576 B |
| 4,692,787 | 9/1987 | Possley et al. | 357/59 |
| 4,881,114 | 11/1989 | Mohsen et al. | 357/54 |
| 5,081,064 | 1/1992 | Inoue et al. | 437/190 |

FOREIGN PATENT DOCUMENTS

| | | | |
|---|---|---|---|
| 56-85846A | 7/1981 | Japan . | |
| 5966144 | 4/1984 | Japan | H01L 21/82 |
| 1-77141A | 3/1989 | Japan . | |

*Primary Examiner*—John Niebling
*Assistant Examiner*—Richard A. Booth
*Attorney, Agent, or Firm*—Wayne P. Bailey

[57] ABSTRACT

A semiconductor structure comprising a polysilicon pad, a metal pad separated from the polysilicon pad by an insulator, and a metal via connecting the pads. A fuse is formed at the intersection of the polysilicon pad and via.

15 Claims, 2 Drawing Sheets

SEMICONDUCTOR FUSE STRUCTURE

This is a continuation of application Ser. No. 08/351,979 filed Dec. 8, 1994 which is a divisional of application Ser. No. 07/832,177 filed Feb. 5, 1992 now U.S. Pat. No. 5,376,820 issued on Dec. 27, 1994.

The present invention relates to a programmable read only memory (PROM). More particularly, it relates to a fuse structure for a PROM.

BACKGROUND OF THE INVENTION

Computers and related electronic equipment typically have a number of different types of data storage or memory devices. For example, a read only memory (ROM) is a semiconductor memory device in which data is permanently stored. The data cannot be overwritten or otherwise altered by the user. A ROM is also non-volatile which means that the data is not destroyed when power is lost. A ROM is "programmed" during its manufacture by making permanent electrical connections in selected memory cells. ROMs are useful wherever unalterable data or instructions are required. A disadvantage of ROMs is that their programming is determined during the design stage and can only be varied by redesigning the chip.

An alternative to a ROM is a programmable read only memory (PROM) which is programmable once after its manufacture. In one type of PROM, each memory cell is provided with an electrical connection in the form of a fusible link. The PROM is "programmed" by blowing the fusible link in selected cells. A PROM is frequently programmed at the factory; however, it is not uncommon for it to be programmed by the purchaser. A clear advantage of a PROM is that a single semiconductor design can have many different applications.

There are a considerable number of known designs for the fusible links used in PROMS. Perhaps the most common is a metal link, such as tungsten, which is narrowed or necked down in one region. To blow the fuse, current is driven through the link. The current heats the link to its melting point and the link is broken. Usually the link breaks in the necked down region because that is where the current density is highest.

One problem with the design of existing fusible links is that they usually call for a relatively high programming current. The requirement for high current can affect the basic manufacturing process for the PROM. For example, a popular process is one which produces MOS transistors in a CMOS configuration. Another process is one which produces bipolar transistors. It is costly to integrate CMOS and bipolar designs into a single process so it is generally preferred to use either a CMOS or bipolar process, but not both. To obtain the high current required to blow a fuse, generally bipolar technology is required. This means that a CMOS PROM design will require bipolar transistors to drive the programming current.

Another problem with existing fuse designs is that certain fuse metals, such as tungsten, require a specialized process to properly deposit them on a chip. As with bipolar transistors, different or specialized processes increase the cost of chip manufacture.

A further problem with existing fuse designs is referred to as "grow back" or "metal migration". Grow back is a phenomenon in which a fuse metal which has been blown grows back together to reconnect the fusible link. Although not completely understood, grow back alters the data stored in the PROM—clearly an undesirable result.

OBJECT OF THE INVENTION

It is therefore an object of the present invention to provide a new and improved semiconductor fuse structure.

It is another object of the present invention to provide a new and improved method for blowing a fuse.

It is a further object of the present invention to provide a CMOS semiconductor fuse structure.

It is yet another object of the present invention to provide a fuse which requires relatively low power to blow.

It is yet a further object of the present invention to provide a semiconductor fuse which resists grow back.

It is still another object of the present invention to provide a fusible link and structure which may be manufactured by a conventional CMOS process.

It is still another object of the present invention to provide a fuse structure which can serve as a building block cell compatible with a conventional CMOS process.

SUMMARY OF THE INVENTION

One form of the present invention is a semiconductor structure comprising a polysilicon pad, a metal pad separated from the polysilicon pad by an insulator, and a metal via connecting the pads. A fuse is formed at the intersection of the polysilicon pad and via.

Another form of the present invention is a method for blowing a fusible link in a semiconductor device by first forming an electrical contact between a resistance element and the fusible link. A current is then driven through the element and link to raise the temperature of the element higher than the melting point of the link, thereby allowing the contact to break.

DESCRIPTION OF A PREFERRED EMBODIMENT

Figure 1:
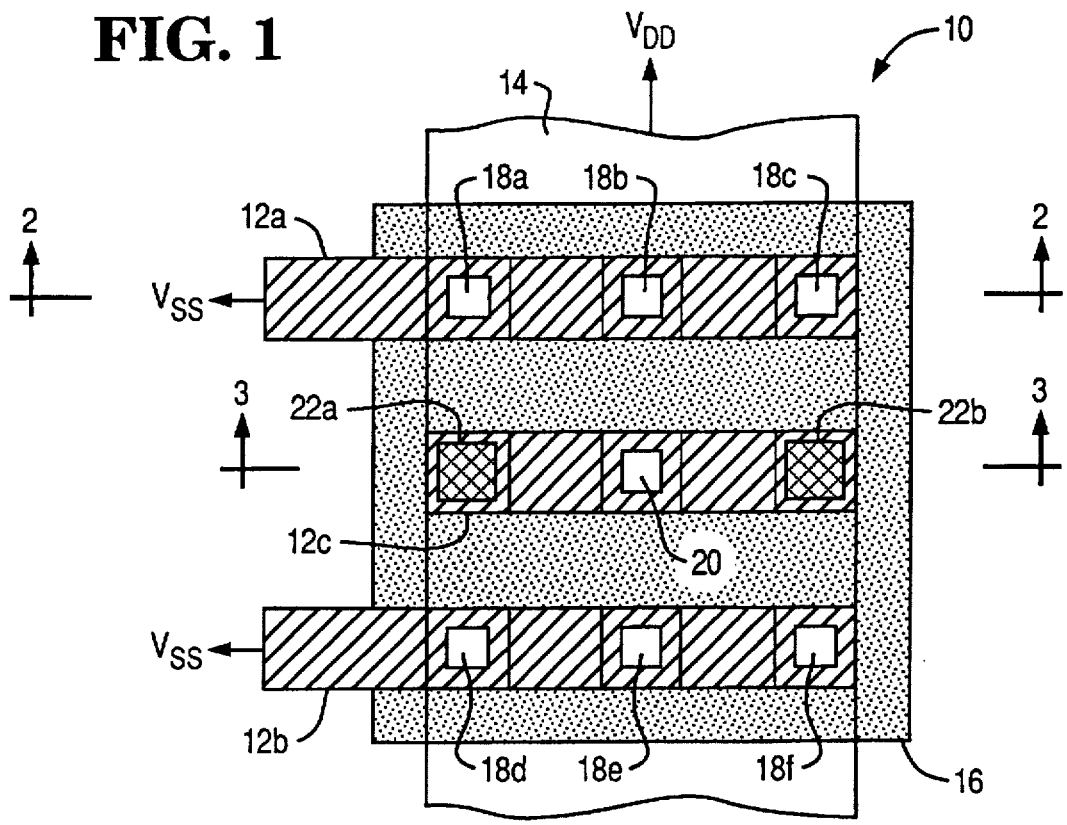
FIG. 1 is a top view of a layout of a fuse structure according to one form of the present invention.
Figure 2:
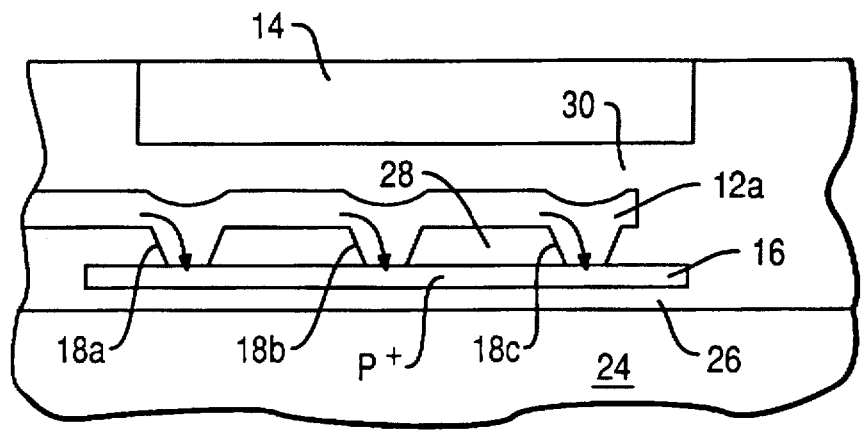
FIG. 2 is a cross section of the fuse structure of FIG. 1 taken along line 2—2.
Figure 3:
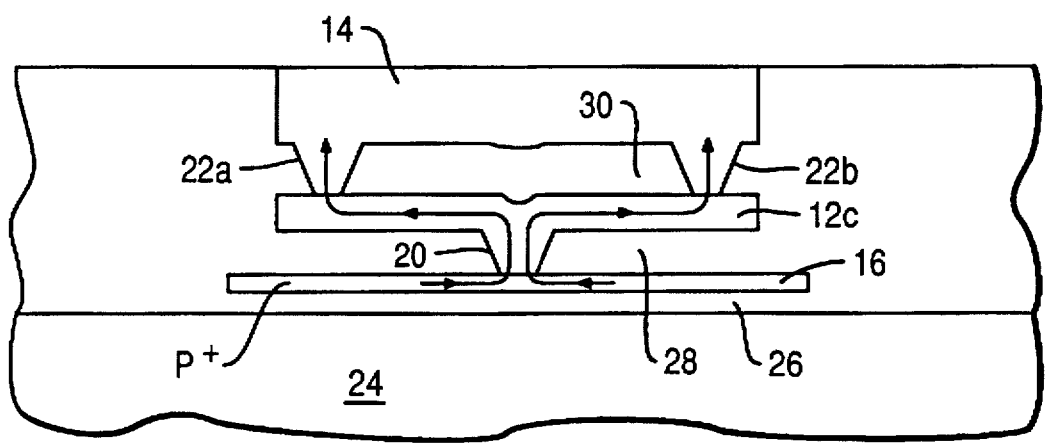
FIG. 3 is a cross section of the fuse structure of FIG. 1 taken along line 3—3.

FIG. 1 shows a top layout view of a fuse structure 10 according to a preferred embodiment of the present invention. It will be appreciated that fuse structure 10 is but a single element on a much larger integrated circuit having perhaps many thousands of other elements including other similar fuse structures. As is typical in integrated circuits, the various circuit elements are connected to reference voltage potentials, such as $V_{DD}$ and $V_{SS}$. To provide the necessary connections, a common arrangement is to have a first pattern of metal lines overlying but electrically insulated from the various circuit elements. This first pattern of metal lines is often referred to as the metal 1 layer. A connection from a metal 1 line to a selected part of a circuit element is made by way of a "via". A better view of a via is shown in FIGS. 2 and 3, as will be described later. Metal 1 lines are generally at the same relative height above the chip substrate. Selected metal 1 lines are connected to a reference voltage potential, such as $V_{SS}$. A second pattern of metal lines overlying but electrically insulated from the metal 1 layer is connected to a second reference voltage potential, such as $V_{DD}$. This second pattern of metal lines is referred to a metal 2 and is selectively connected to underlying circuit elements by vias.

The metal 1 layer, as shown in FIG. 1, includes metal runs 12a and 12b and a metal pad 12c. Metal runs 12a and 12b are connected to $V_{SS}$. The metal 2 layer includes a metal run 14 which is connected to $V_{DD}$. (Metal run 14 is shown in outline only to reveal underlying features.) A polysilicon pad 16 underlies metal 1 and metal 2 but overlies the substrate (not shown). The interconnections between metal runs 12a, 12b, metal pad 12c, metal run 14 and polysilicon pad 16 are made by a number of vias. Specifically, metal run 12a is connected to polysilicon pad 16 by vias 18a, 18b and 18c. Metal run 12b is connected to polysilicon pad 16 by vias 18d, 18e and 18f. Metal pad 12c is connected to polysilicon pad 16 by via 20, and is connected to metal run 14 by vias 22a and 22b.

FIG. 2 is a cross sectional view taken along the line 2—2 in FIG. 1. A conventional chip base or substrate 24 with overlying oxide layer 26 is shown. Polysilicon pad 16 is formed on top of oxide layer 26. Metal run 12a overlies polysilicon pad 16 and is separated therefrom by oxide insulator 28. Vias 18a, 18b and 18c electrically connect metal run 12a to polysilicon pad 16. Metal run 14 is separated from metal run 12a by oxide insulator 30. It should be appreciated that a cross sectional view taken along metal run 12b in FIG. 1 would reveal a similar configuration to that shown in FIG. 2.

FIG. 3 is a cross sectional view taken along the line 3—3 in FIG. 1. Metal pad 12c is separated from polysilicon pad 16 by oxide insulator 28 and from metal run 14 by oxide insulator 30. Metal pad 12c is also separated from metal runs 12a and 12b by an oxide insulator (not possible to show in FIG. 3 because runs 12a and 12b are in the same horizontal plane as pad 12c). The electrical connection between metal pad 12c and metal run 14 is provided by vias 22a and 22b. Of particular interest is via 20 which forms the sole electrical connection between metal pad 12c and polysilicon pad 16. Via 20 is preferably aluminum and forms a fusible link at its intersection with polysilicon pad 16.

Current flow through fuse structure 10 will now be described with reference to FIGS. 1, 2 and 3. Assuming current flow from $V_{SS}$ to $V_{DD}$, current flows from metal run 12a into polysilicon pad 16 through vias 18a, 18b and 18c, as shown by the arrows in FIG. 2. Similarly, current flows from metal run 12b into polysilicon pad 16 through vias 18d, 18e and 18f. Each via 12a—12f provides a separate parallel current path from voltage reference potential $V_{SS}$ into polysilicon pad 16. All of these parallel current paths converge at via 20 seeking a return path to $V_{DD}$, as shown by arrows in FIG. 3. Via 20 provides the only current path out of pad 16. Current that is driven through via 20 flows into metal pad 12c from where it has parallel paths to metal run 14 and $V_{DD}$ through vias 22a and 22b.

In operation, the fuse is blown by driving a current from metal runs 12a and 12b through vias 18a–18f, into polysilicon pad 16, through via 20 into metal pad 12c and through vias 22a and 22b into metal run 14. When sufficient programming current is provided, the fusible link or via 20 will break at its intersection with polysilicon pad 20.

Certain physical features of fuse structure 10 are particularly significant. First, is the choice of materials. The pad 16 material, polysilicon, has a relatively high electrical resistance and melting point compared to the fusible link material, aluminum. Less current is required to heat polysilicon to the melting temperature of aluminum than the current required in an all aluminum fuse. Therefore, polysilicon pad 16 in the vicinity of via 20 is essentially a resistance heating element which provides the heat needed to melt the aluminum fusible link. In addition, polysilicon alloys or absorbs the melted aluminum. This helps prevent the aluminum from subsequently growing back.

Second, is the current concentration. By providing (1) multiple parallel current paths into polysilicon pad 16; (2) multiple parallel current paths out of metal pad 12c; and (3) a single current path between pads 16 and 12c, the current density is highest between via 20 (the fusible link) and polysilicon pad 16. This reduces the current needed to blow the fuse and assures that when the fuse is blown, the break will occur at the intersection of via 20 and polysilicon pad 16.

Third is the physical relationship between via 20 and polysilicon pad 16, particularly at the electrical contact therebetween. As shown in FIG. 3, polysilicon pad 16 is generally in a horizontal plane and via 20 is generally vertical. This orthogonal relationship is also generally true for the current flow therebetween. This relationship enhances the current density in the vicinity of the fusible link as well as providing some additional resistance to grow back.

The foregoing features are significant for several reasons. First, the current required to blow the subject fuse is much less than that for conventional all metal fuses. Thus, the present fuse finds important application in a conventional CMOS process. (Bipolar transistors are not required to provide the programming current.) Second, the choice of aluminum allows the subject fuse structure to be easily incorporated into a standard CMOS process. More complicated or expensive processes such as those involving tungsten deposition are also avoided.

Figure 4:
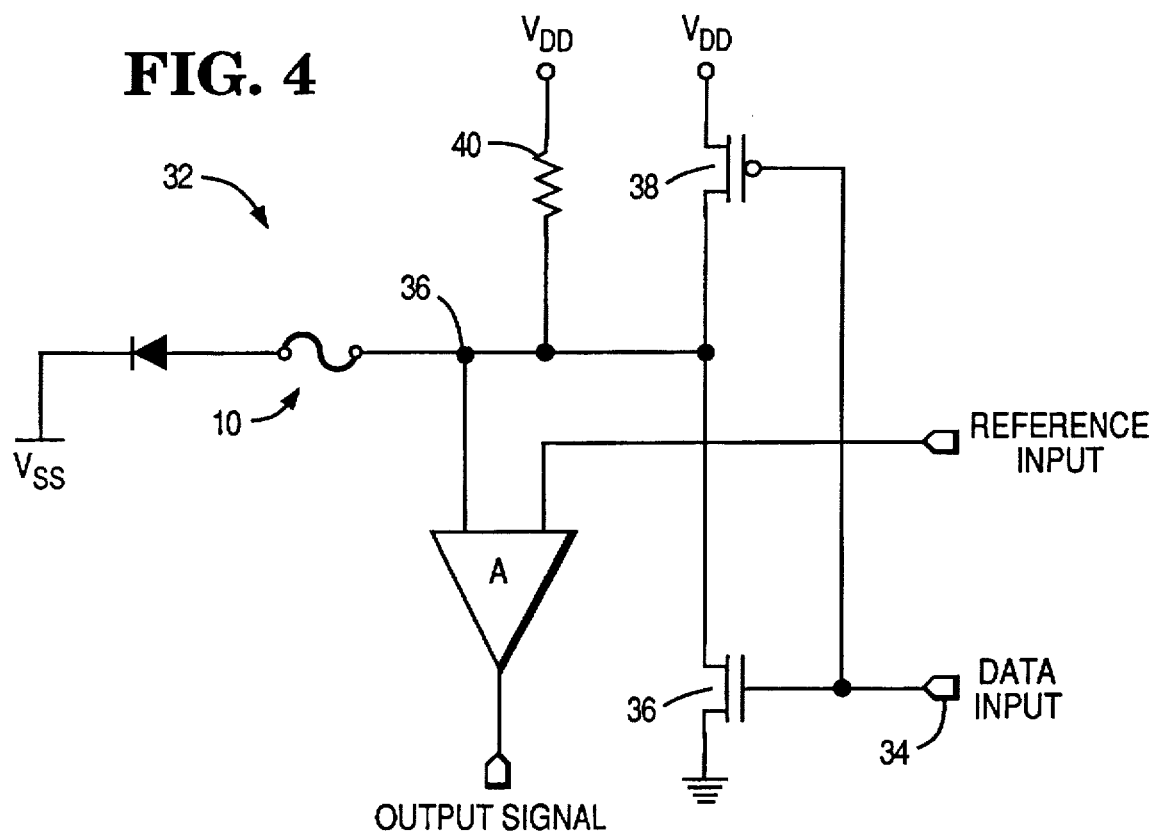
FIG. 4 is a schematic of a circuit utilizing the fuse structure of FIG. 1.

FIG. 4 is a schematic showing a circuit for a PROM cell 32 utilizing the fuse structure 10. When cell 32 is programmed, a high of low voltage is applied to data input 34. A high voltage or "one" applied to input 34 turns on NMOS transistor 36, preventing current flow through fuse structure 10. Thereafter, fuse structure 10 pulls data storage node 36 low, keeping the value "stored" by node 36 as a "zero". Alternatively, if a low voltage or "zero" is applied to data input 34, PMOS transistor 38 is turned on thereby connecting $V_{DD}$ to $V_{SS}$ through fuse structure 10. The current driven therethrough is sufficient to blow the fuse. Thereafter, fuse structure 10 is an open circuit allowing storage node 36 to be maintained as a "one" at approximately the voltage of $V_{DD}$ through pullup resistor 40.

It will be clear to those skilled in the art that the present invention is not limited to the specific embodiment disclosed and illustrated herein. For example, a single metal 1 connection to $V_{SS}$, such as metal run 12a could be utilized in lieu of two metal runs 12a and 12b.

It will be understood that the dimensions and proportional and structural relationships shown in the drawings are illustrated by way of example only and these illustrations are not to be taken as the actual dimensions or proportional structural relationships used in the fuse structure of the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method comprising:

forming an electrical contact between a resistance element and a fusible link in a semiconductor device, said element and link being initially non-alloyed with one another and having different chemical compositions; and then driving a current through said element and link to raise the temperature of the element higher than the melting point of the link, thereby allowing the contact to break.

2. A method comprising:

forming an electrical contact between a resistance element and a fusible link in a semiconductor device; and driving a current through said element and link to raise the temperature of the element higher than the melting point of the link, thereby allowing the contact to break, wherein said contact is formed so that the current flow in the resistance element is generally orthogonal to the current flowing simultaneously in the fusible link.

3. The method of claim 2 wherein said resistance element is polysilicon and said fusible link is aluminum.

4. A method for blowing a fusible link comprising:

locating a resistance element adjacent said link, said element and link being initially non-alloyed with one another and having different chemical compositions; and then driving a current through said element to raise the temperature of the element higher than the melting point of the link.

5. The method of claim 4 wherein the element and link have different resistivity.

6. The method of claim 5 wherein the element has higher resistivity than the link.

7. A method for fusing a fusible link in contact with a resistive element, comprising the steps of coupling said resistive element to a first voltage supply and coupling said fusible link to a second voltage supply to drive a current from the first voltage supply through the resistive element and then through the fusible link to raise the temperature of the resistive element higher than the melting point of the fusible link.

8. The method of claim 7, wherein electrical resistance of the resistive element is greater than electrical resistance of the fusible link.

9. The method of claim 7, wherein the resistive element is polysilicon.

10. The method of claim 9, wherein the fusible link is aluminum.

11. A method for fusing a fusible link, comprising the steps of:

driving a current from a first metal, through a plurality of parallel current paths, to a polysilicon pad; and driving said current from said polysilicon pad, through the fusible link, to a second metal.

12. The method of claim 11, wherein the first metal is a layer of metal in an integrated circuit device.

13. The method of claim 12, wherein the second metal is another layer of metal in the integrated circuit device.

14. The method of claim 11, wherein a metal pad is coupled between the fusible link and the second metal.

15. The method of claim 14, wherein another plurality of parallel current paths are coupled between the metal pad and the second metal.

* * * * *